United States Patent [19]

Hartstein et al.

[11] Patent Number: 5,010,512

[45] Date of Patent: Apr. 23, 1991

[54] NEURAL NETWORK HAVING AN ASSOCIATIVE MEMORY THAT LEARNS BY EXAMPLE

[75] Inventors: Allan M. Hartstein, Chappaqua; Roger H. Koch, Amawalk, both of N.Y.

[73] Assignee: International Business Machines Corp., Armonk, N.Y.

[21] Appl. No.: 296,111

[22] Filed: Jan. 12, 1989

[51] Int. Cl.$^5$ .................... G06G 7/00; H03K 19/08
[52] U.S. Cl. ........................ 364/807; 307/201; 364/513
[58] Field of Search ............. 364/807, 602, 513, 131, 364/200 MS File, 900 MS File; 307/201

[56] References Cited

U.S. PATENT DOCUMENTS

| | | |
|---|---|---|
| 4,660,166 | 4/1987 | Hopfield . |
| 4,760,437 | 7/1988 | Denker et al. . |
| 4,773,024 | 9/1988 | Fassin et al. ............ 364/513 |
| 4,774,677 | 9/1988 | Buckley ............... 364/513 |
| 4,866,645 | 9/1989 | Lish ..................... 307/201 |
| 4,906,865 | 3/1990 | Holler .................. 307/201 |
| 4,918,618 | 4/1990 | Tomlinson, Jr. ........ 364/807 |
| 4,950,917 | 8/1990 | Holler et al. ........... 307/201 |
| 4,951,239 | 8/1990 | Andes et al. ........... 307/201 |

OTHER PUBLICATIONS

"Neural Computation of Decisions in Optimization Problems" by Hopfield et al., *Biol. Cybern*, vol. 52, 141 (1985).
"A CMOS Associative Memory Chip" by Graf et al., *Proceedings of IEEE First International Conference on Neural Networks*, 461 (1987).
"Neural Networks and Physical Systems with Emergen Collective Computational Abilities" by Hopfield, *Proc. Nat'l. Acad. Sci.*, U.S.A., vol. 79, 2554 (Apr. 1982).
"Parallel Visual Computation" by Ballard et al., *Nature*, vol. 306, 21 (Nov. 1983).
"A Basic MOS Neural-Type Junction, A Perspective on Neural-Type Microsystems" by El-Leithy et al., *IEEE First Int. Conf. on Neural Networks*, ed. M. Caudill and C. Butler, (SOS Printing, San Diego, 1987), III-469-477.
"Neural Networks: Glamour and Glitches" by Williamson, *Computer-World*, Feb. 15, 1988, p. 89.
"Theory of MNOS Memory Transistor" by Chang, *IEEE Trans. Electron Devices*, ED-24, 511 (1977).

Primary Examiner—Jerry Smith
Assistant Examiner—Jim Trammell
Attorney, Agent, or Firm—Scully, Scott, Murphy & Presser

[57] ABSTRACT

A neural network utilizing the threshold characteristics of a semiconductor device as the various memory elements of the network. Each memory element comprises a complementary pair of MOSFETs in which the threshold voltage is adjusted as a function of the input voltage to the element. The network is able to learn by example using a local learning algorithm. The network includes a series of output amplifiers in which the output is provided by the sum of the outputs of a series of learning elements coupled to the amplifier. The output of each learning element is the difference between the input signal to each learning element and an individual learning threshold at each input. The learning is accomplished by charge trapping in the insulator of each individual input MOSFET pair. The thresholds of each transistor automatically adjust to both the input and output voltages to learn the desired state. After input patterns have been learned by the network, the learning functions is set to zero so that the thresholds remain constant and the network will come to an equilibrium state under the influence of a test input pattern thereby providing, as an output, the learned pattern most closely resembling the test input pattern.

28 Claims, 5 Drawing Sheets

NEURAL NETWORK HAVING AN ASSOCIATIVE MEMORY THAT LEARNS BY EXAMPLE

BACKGROUND OF THE INVENTION

1. Field of the Invention

This invention relates to networks for processing information and more particularly, to neural networks implemented in semiconductor device technology.

2. Description of the Prior Art

Much interest has been generated recently in the field of neural networks for processing information. A neural network is an electronic network which in some fashion mimicks the structure and function of the neurons found in living organisms. The ultimate goal is to construct an artificial system that can display all or some of the powerful functions of biological systems.

The scope of the work that has been done in the area of neural networks is quite extensive. In one prior art system, key features of the organic neuronal system are used in designing an electronic network to achieve a better understanding of these same biological features, see Hopfield, *Proceedings National Academy Science USA* 79,2554 (1982), while another system tries to imitate the functioning of the neurons in intricate detail, see El-Leithy, et al., *IEEE First International Conference on Neural Networks* (1987). Some networks have been modeled and/or constructed in order to solve very specific problems, such as speech generation, see Sejnowski, et al., *John Hopkins University Technical Report* JHU/EECS-86/01, 1986, or vision, see Ballard, et al., *Nature* 306, 21 (1983). Other networks seek to be more general in scope, hoping to define solutions to a whole class of problems, see Hopfield, et al., *Biological Cybernetics* 52, 141 (1985).

The Hopfield network, which is described in detail in U.S. Pat. No. 4,660,166, is a complex network of interconnections of non-linear switches that mimick the behavior of a spin glass. The Hopfield network is a matrix of output and input conductors where the output conductors form a plurality of "neurons". Each neuron of the network consists of a series of inputs and a simple threshold switch, with each input being multiplied by a parameter which is either learned or programmed into the network. The input products are then summed together and if the sum exceeds a particular threshold, the output of the neuron is set to the "on" state, otherwise the output will be in the "off" state. The output of each neuron is connected to the input of every neuron in the network thereby forming a totally interconnected network. The essential "memories" built into the network are contained in the multiplicative parameters applied to the neuronal inputs. The multiplicative parameters are provided by resistors coupled to each of the threshold switches.

The Hopfield type of network has been shown to display a large number of desirable qualities which are at least reminiscent of the functioning of biological neural networks. For example, the network can solve pattern recognition problems in a parallel mode. In addition, the network is capable of finding the closest match pattern in memory to an input pattern even when many of the input bits are in error or missing. The network is considered to be a content addressable memory. The memories are distributed over the network and are not contained in any one physical portion of the network. Therefore, the network can successfully operate when a portion of the network is erased or altered.

This type of network does have several limitations. The network will always return a pattern in response to the specified input which may not be the pattern desired. Furthermore, it does not have the built in capability to decide if the match is too far off from the input that no result should be returned.

While the Hopfield type network has been shown to work in computer simulations, difficulty has arisen in implementing the network in hardware devices. More particularly, it would not be practical to make a very large network in which the memory elements are embodied by resistors and the active elements are multitransistor circuits. U.S. Pat. No. 4,760,437 discloses one implementation of a Hopfield neural network by utilizing photoconductors as the memory elements with the desired impedance being established by controlling the level of light incident thereon. Another prior art example of the fabrication of a real network is shown by Graf, et al., see *Proceedings of IEEE First International Conference on Neural Networks*, 461 (1987), in which there is disclosed a CMOS associative memory chip for implementing the Hopfield matrix of resistive coupling elements interconnecting an array of transistor amplifiers. In contrast with the Hopfield network the data stored by the network is represented locally in the matrix thereby reducing the number of required interconnections.

SUMMARY OF THE INVENTION

The present invention is directed to a Hopfield type neural network which utilizes the threshold value of a semiconductor device, such as a MOSFET, as the essential coupling parameter of the network in contradistinction to the resistive elements employed by the prior art systems. The network is interconnected to provide local learning of the input data by adjusting the threshold value of the individual MOSFETs. MOSFETs are inherently a threshold type device whose output response can be altered by changing its threshold voltage; the voltage at which it starts to conduct current. The threshold of a particular MOSFET can be altered simply by changing the charge stored in the insulator of the transistor. In addition, over a fairly broad range, the current carried by a MOSFET is a linear function of the bias voltage above the device threshold. By using the threshold of a MOSFET as the learning parameter at each network intersection, the network is no longer multiplicative in nature and is, therefore, much easier to implement in hardware.

The neural network of the present invention comprises a plurality of neurons each of which is essentially a threshold switch with many inputs. The switch sums the input functions and then determines whether or not it will be in the on state. The network provides "local" learning by coupling the outputs of each neuron to the inputs of a selected number of adjacent neurons. The input functions are not multiplicative as in the prior art systems, but rather represent the difference between the input signal and an individual learned threshold at each input. In an illustrative embodiment of the invention, each input of a neuron consists of a pair of MOS transistors, one an n-channel MOSFET and the other a p-channel MOSFET. Each MOSFET pair represents the "synapse" of the neuron. The pair of complementary MOSFETS is necessary to provide a symmetrical output response which is monotonically increasing about the threshold value of the MOSFET. The importance of the symmetry of the output response will be discussed in more detail below. A number of these pairs are coupled in parallel to an output conductor which assures that the currents will sum together. The resulting output is fed into the threshold switch of the neuron. The output conductors represent the dendrites of the neuron. Each complementary pair of MOSFETs comprises the individual learning elements of the network and the learned information is stored in the network as the individual thresholds of the MOSFETs.

In a preferred embodiment of the invention, the neurons are provided by a multigate n-channel MOSFET and a multigate p-channel MOSFET in which the sources and drains are connected in parallel. Corresponding pairs of gates of the complementary multigate MOSFETs are connected together to provide the various inputs to the neuron. The output threshold device is provided by a single MOSFET.

The local learning is accomplished by charge trapping in the gate insulator of the multigate MOSFETs. The charge trapping in the insulator of each individual input transistor causes the thresholds of each transistor to automatically adjust in response to both the input and output voltages in such a way that each transistor will tend to reinforce the current state of the network. Each transistor will locally learn to either enhance or inhibit its output as it learns, and if an input pattern is continuously presented to the network over time, each transistor will learn a simple average over the conditions it encounters. Thus, the network learns by example.

The network of the present invention can be operated in two modes, a learning mode and an associative memory mode. In the learning mode, an input pattern is applied to the network and the threshold values of the input transistors are continuously adjusted until the input pattern is learned. Multiple patterns may be learned by the network by sequentially presenting the patterns to the network. In the associative memory mode, the threshold values remain constant and a test input is applied to the network. The output voltages of the learning elements will then reach a steady state thereby providing as an output the learned pattern which is most similar to the test pattern.

DETAILED DESCRIPTION OF THE INVENTION

Figure 1:
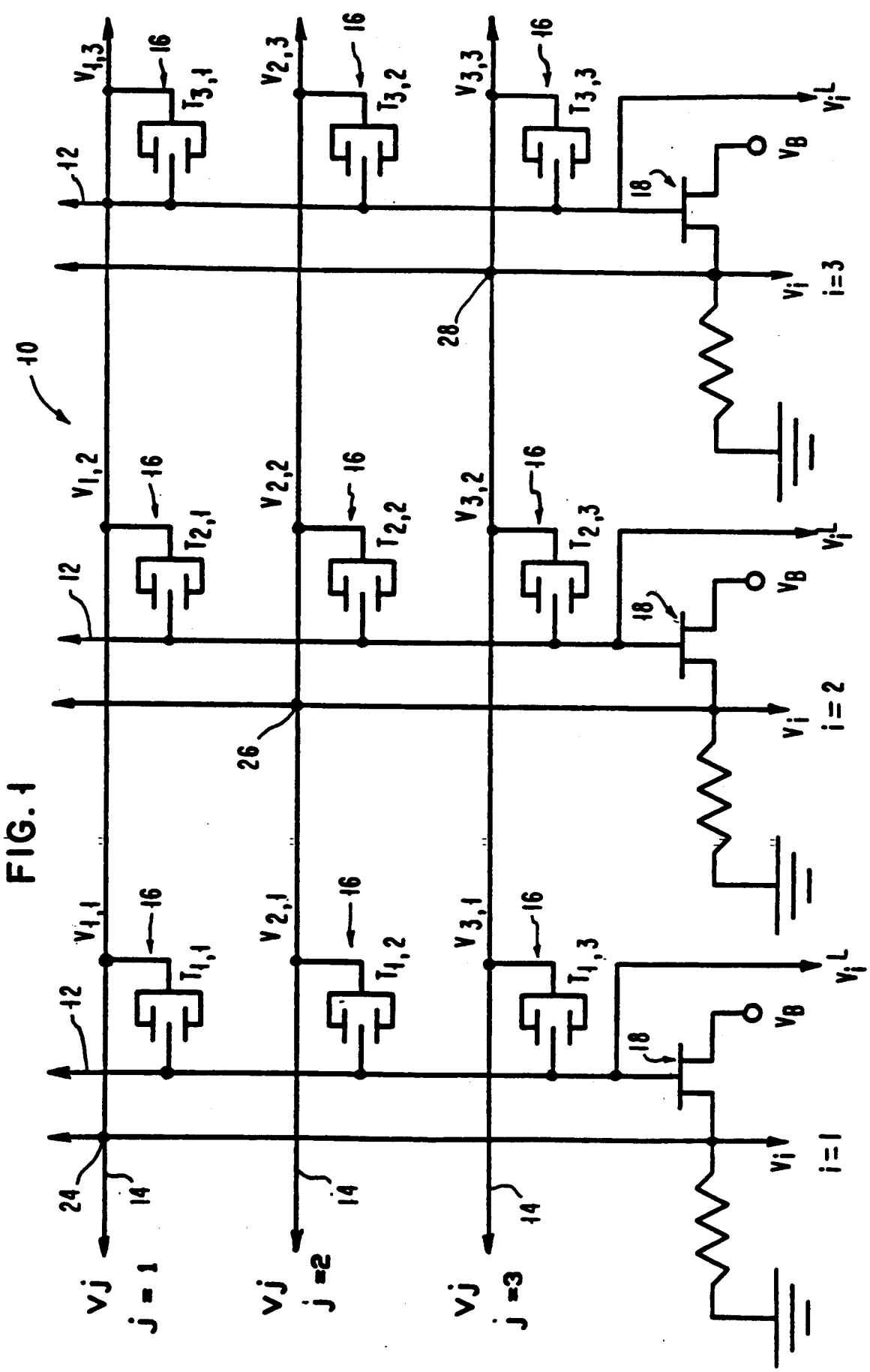
FIG. 1 is a schematic diagram of a neural network of the present invention.

Referring now to the drawings, FIG. 1 is a schematic representation of a portion of a neural network in accordance with the present invention. The network 10 shown in FIG. 1 includes a plurality of output electrodes 12 and a plurality of input electrodes 14. The network also includes a plurality of electronic learning elements 16 interconnecting the output electrodes 12 and the input electrodes 14. The number of output and input electrodes in the network depends upon the design application, and as an illustration only, FIG. 1 shows a 3×3 matrix. For the purposes of notation, output electrodes 12 are designated by an i, where i goes from 1 to M and the input electrodes 14 are designated by a j, where j goes from 1 to N. M is equal to the total number of output electrodes and N is equal to the total number of input electrodes, where N and M may be any integer greater than O. In FIG. 1, N and M are both equal to 3. Each output electrode 12 includes an output amplifier 18 having an output voltage designated $V_i$. Each of the learning elements 16 in each output electrode 12 has a threshold voltage $T_{ij}$ and each has an input voltage $V_j$. A learning electrode 17 is coupled to each output amplifier 18 for inputting the states, voltages $V_i^L$, to be learned by the network 10. In the 3×3 matrix of FIG. 1, the output electrodes are designated i=1, 2 and 3 and the input electrodes 14 are designated j=1, 2 and 3. Each of the learning elements 16 has a $T_{ij}$ threshold corresponding to the intersecting output and input electrodes. In the output electrode i=1, the learning elements 16 have thresholds $T_{1,1}$, $T_{1,2}$, and $T_{1,3}$, while the inputs to each of the elements are $V_1$, $V_2$ and $V_3$, respectively. The remaining learning elements 16 are similarly designated as shown.

Figure 2:
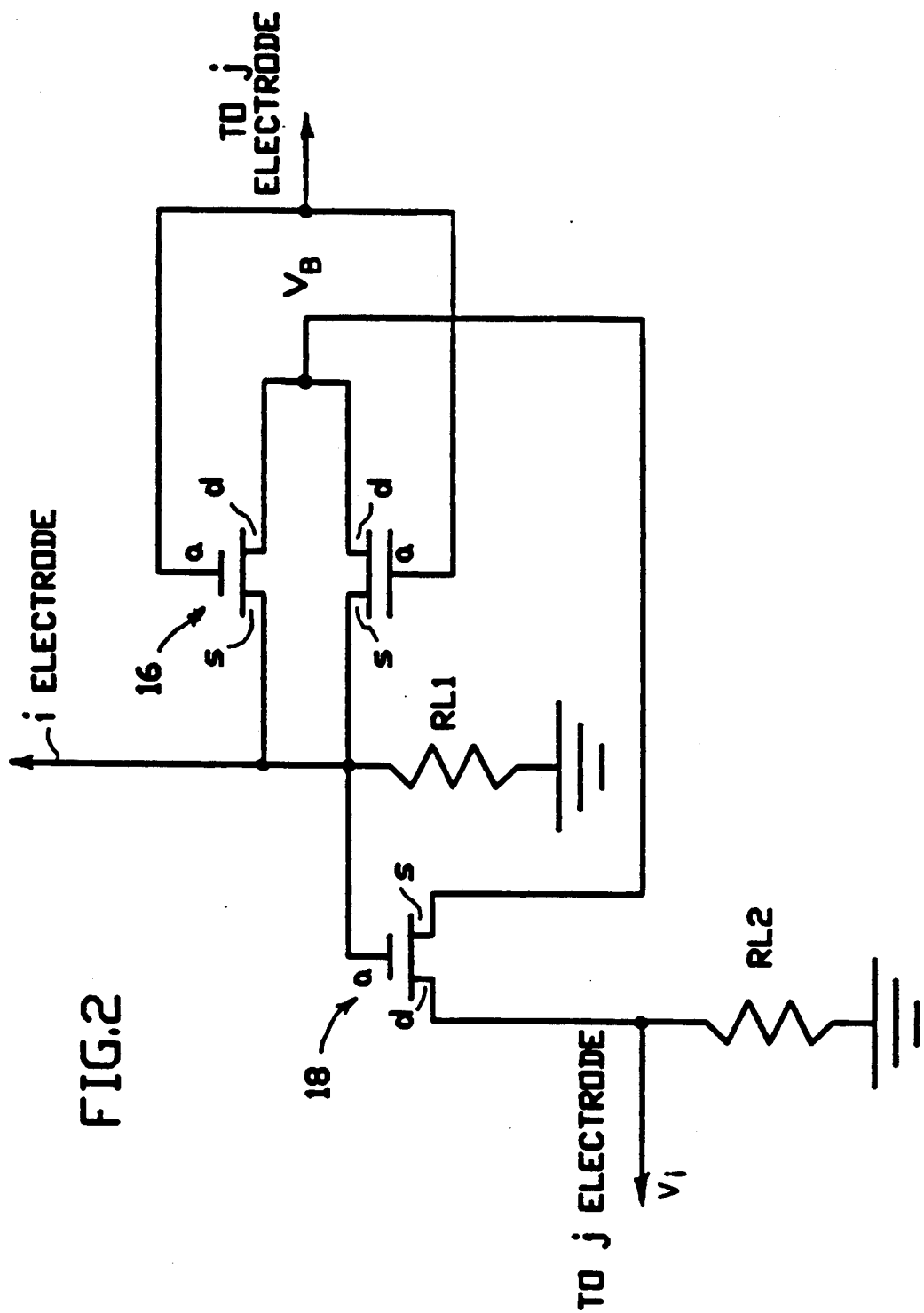
FIG. 2 is a schematic of one node of the neural network of FIG. 1.

A detailed schematic of one of the learning elements 16 is shown in FIG. 2. Each element 16 includes an n-channel MOSFET 20 and a p-channel MOSFET 22 connected in parallel. The MOSFETs 20 and 22 are connected in parallel as shown by coupling the drains together, coupling the sources together and coupling the gates together. The sources are connected through a load resistor RL1 to a fixed potential such as ground and to the gate of the output amplifier 18, which may be a MOSFET. The drains are coupled to the source of the output MOSFET 18 and the supply voltage $V_B$. The gates are coupled together and are connected to the appropriate j electrode. The drain of the output MOSFET 18 provides the output voltage $V_i$ and is coupled to ground through resistor RL2.

Referring again to FIG. 1, each output $V_i$ is fedback to one j input electrode 14 on electrode 19. $V_i$ is connected to one learning element 16 in the ith electrode 12 and to a respective learning element in the two adjacent electrodes 12. The network of FIG. 1 is merely illustrative and the number of neighboring electrodes 12 to which the outputs are connected will depend upon the total number of output and input electrodes of the network. As shown, $V_1$ is connected to $J_1$ at node 24, $V_2$ is connected to $J_2$ at node 26 and $V_3$ is connected to $J_3$ at node 28. The $V_1$ output voltage is therefore inputted to the three i electrodes at nodes $V_{1,1}$, $V_{1,2}$, and $V_{1,3}$. The $V_2$ voltage is inputted to the three i electrodes at nodes $V_{2,1}$, $V_{2,2}$ and $V_{2,3}$. The $V_3$ output voltage is similarly inputted as shown.

Each learning element 16 carries a current which, to a good linear approximation, is proportional to the absolute value of the difference between the input gate voltage and the threshold voltage at its input. The output voltage for each neuron is therefore proportional to the sum of the outputs of each learning element and is given by the equation:

$$V_i^L = a \sum_{j=1}^{j=N} |V_j - T_{ij}| \qquad (1)$$
$$a > o$$

where a is a constant greater than zero that is determined by the gain of the learning elements 16.

Equation (1) represents the summation of the outputs of each learning element 16 in each output column electrode, which is a good representation of the pair of input MOSFETs when each transistor has the appropriate coupled thresholds and is operated in the linear regime. When operating in this manner, current is only flowing through one of the transistors in the pair at any one time. The essential symmetry of the output response is captured in the absolute value function. The exact form of this function is not critical, and the following equation will also work equally well:

$$V_i^L = a \sum_{j=1}^{j=N} (V_j - T_{ij})^2 \quad a>0 \quad (2)$$

Equation (2) will also provide the necessary symmetry. As an illustration of Equation (1), output voltage $V_1^L$ in FIG. 1 is equal to the sum of:

$$a|V_1 - T_{1,1}| + a|V_2 - T_{1,2}| + a|V_3 - T_{1,3}|.$$

Figure 3:
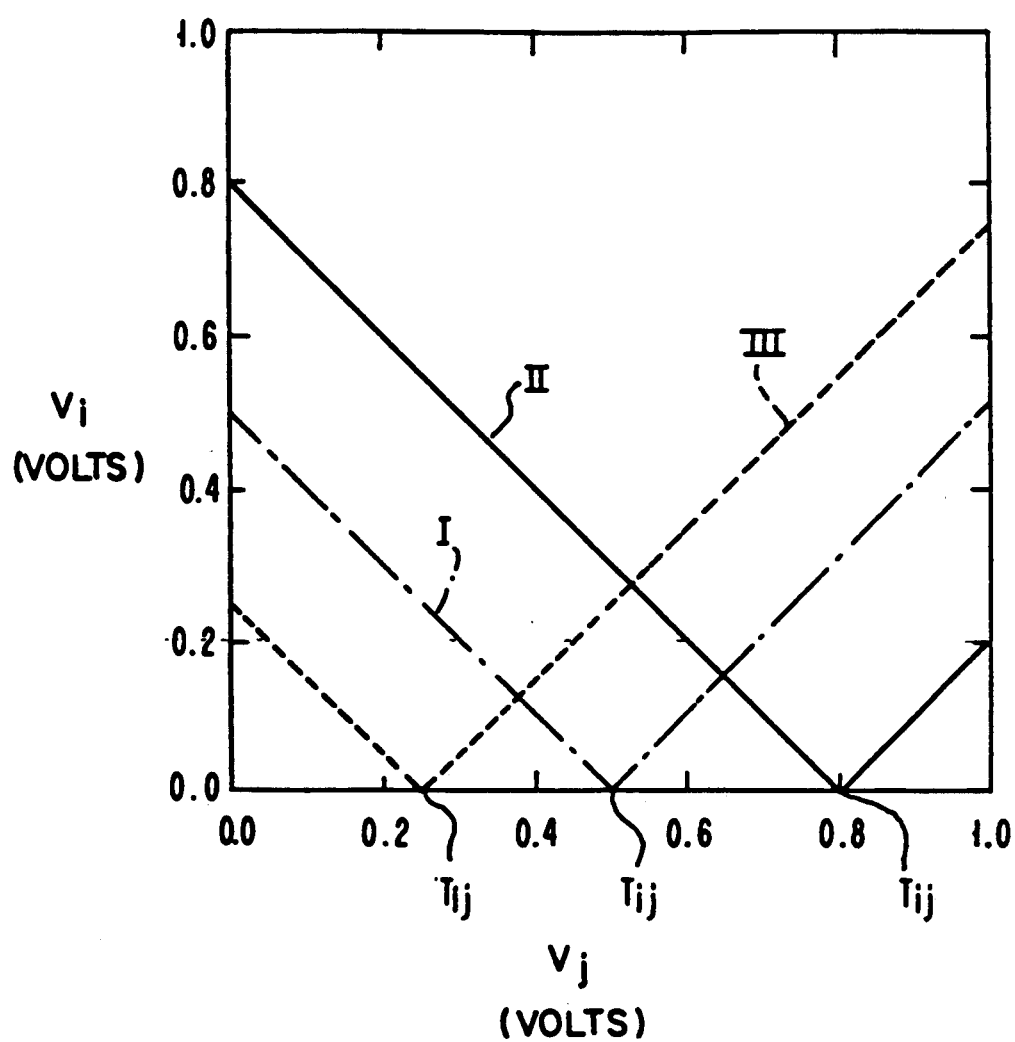
FIG. 3 is a graphical representation of the relationship between the input and the output voltage of a network node.

FIG. 3 shows the functional form of each input MOSFET of the network. FIG. 3 is a representation of the output verses the input function of a learning element 16 which exhibits a symmetrical "V" shape. Three curves are shown illustrating the position of the function for different thresholds. Curve I is for a FET having threshold, $T_{ij}$, of 0.5 volts, curve II is for a FET having a threshold, $T_{ij}$, of 0.8 volts, and curve III is for a FET having a threshold $T_{ij}$ of about 0.2 volts. Curves for Equation (2) are not shown but would exhibit a "U" shape that would provide similar functional results.

In order to have a dynamical learning network which incorporates a local learning algorithm, data must be represented in a very particular way. The learning parameter must either locally enhance or inhibit a particular output based on the input presented. In binary notation, enhancing means that if the input to a node is 1 the output should be 1, and if the input is 0 the output should be 0. Similarly, inhibiting means that an input of 1 gives an output of 0, and an input of 0 gives an output of 1. This implies that when a node learns that an input of 1 should give an output of 1, it is also learning that an input of 0 gives and output of 0. Any other internal representation of memory does not yield the desired result. Thus, symmetry is required in the structures and the equations representing the function of the structures.

As noted above, the pair of complementary MOSFETs have an output versus input function that gives the desired symmetry. The local learning algorithm must also possess a certain symmetry so that the threshold values of the MOSFETs adjust in a similar manner whether the output is being enhanced or inhibited. In the learning mode, the thresholds $T_{ij}$ must be pushed to lower values (enhancing) whenever $V_i$ and $V_j$ are the same. Likewise, $T_{ij}$ must be pushed to larger values (inhibiting) whenever $V_i$ and $V_j$ are different. One suitable learning scheme is given by the equation:

$$T_{ij}^* = T_{ij} + a(|V_j - V_i| - \beta) \quad (3)$$

where $T_{ij}^*$ is the new threshold value, $T_{ij}$ the former threshold value, and where $a$ and $\beta$ are constants. $a$ is typically a small number that defines a learning rate or the relative amount that the threshold will adjust. $\beta$ defines a nominal threshold position and ensures symmetry by pushing $T_{ij}$ up or down by the same relative magnitudes given the V's involvement. In an illustrative embodiment, where the V's and T's range from 0 to +1 as in FIG. 3, the nominal threshold value would be set to 0.5. As an example, with $\beta$ set to 0.5, for the case where $V_i$ is equal to $V_j$, the threshold would be pushed lower by an amount $\frac{1}{2}a$, and for the extreme case where $V_j$ is 1 and $V_i$ is 0, the threshold would be pushed higher by an amount $\frac{1}{2}a$.

Learning is accomplished by charge trapping in the gate insulator of the MOSFETs. The individual transistors must be designed such that when a voltage difference is applied across the insulator a small current flows. A percentage of this current will be trapped in the insulator, resulting in a threshold shift. If a negative voltage is applied, electrons are assumed to be trapped, which pushes the threshold to a more positive voltage level. Similarly, if a positive voltage is applied, electrons are also trapped, pushing the threshold to a more positive level. In addition, the transistor design parameters must be chosen such that when no voltage difference exists across the insulator, trapped charge leaks out of the insulator. It is advantageous to adjust the trapping rate and the leakage rate to be equal. In terms of Equation (3), the trapping rate is given by the constant $a(1-\beta)$ and the leakage rate is given by $a\beta$, where the voltage applied to the gate, $V_G = (V_j - V_i)$, is equal to 1. Using this scheme, the thresholds for the individual gate regions will dynamically adjust themselves to reflect the average conditions found in each gate over time, a local learning algorithm. The overall functioning of the network will then be of that of a neuronal network.

The adjustment of the thresholds in accordance with Equation (3) tends to reinforce the current state of the network. If the gate of a particular transistor is high and the transistor is conducting, then the threshold will adjust in such a way as to make the transistor more conducting. Thus, as shown in FIG. 3, the threshold values for Curves I and II would shift to lower values towards 0.0. If the gate is high and the transistor is not conducting because of the other parallel transistors, then the threshold will adjust to make the transistor less likely to conduct. In this case, the threshold values would shift towards 1.0 in FIG. 3. This is essentially a simple Hebbian learning rule see, Hebb, *Organization of Behavior*, John Wiley & Sons, 1949, and it is a property of the present network which does not need any additional circuitry to implement. The learning rule is such that locally, each transistor will learn to either enhance or inhibit its input as it learns. In addition, if multiple states are encountered over time, each transistor will learn a simple average over the conditions it encounters.

The network of the present invention is capable of learning by example and later recalling the learned states. It also has the property that it can forget old states over time. These concepts can be implemented in either of two modes. In a learning mode, a set of inputs/outputs, $V_i^L$, applied to the learning electrodes, are presented to the network and the thresholds will continually adjust in accordance with Equation (3) until the network learns the desired output states. In a test mode, learning is inhibited by setting the learning parameter $a$ to 0 so that the thresholds no longer adjust. This can be accomplished by dropping the voltage applied to the learning elements through the learning electrodes so that charge trapping no longer occurs. Any other means for preventing charge trapping may be employed such as temperature reduction, etc. A set of inputs $V_j$ is then automatically presented to the network and the outputs of each learning element will change in accordance with Equation (1) or (2) and provide a network output that is the closest match to the learned outputs. The memory therefore functions as a static associative memory with all the desirable qualities of an associative memory. In the dynamical learning mode, the learning parameter is never set to zero. The learning and associative memory functions go on continuously. This means that new states presented to the system are learned over time. At the same time, all learned states which are accessed are continually reinforced. The old memories which fall into disuse are slowly forgotten by the system.

Figure 4:
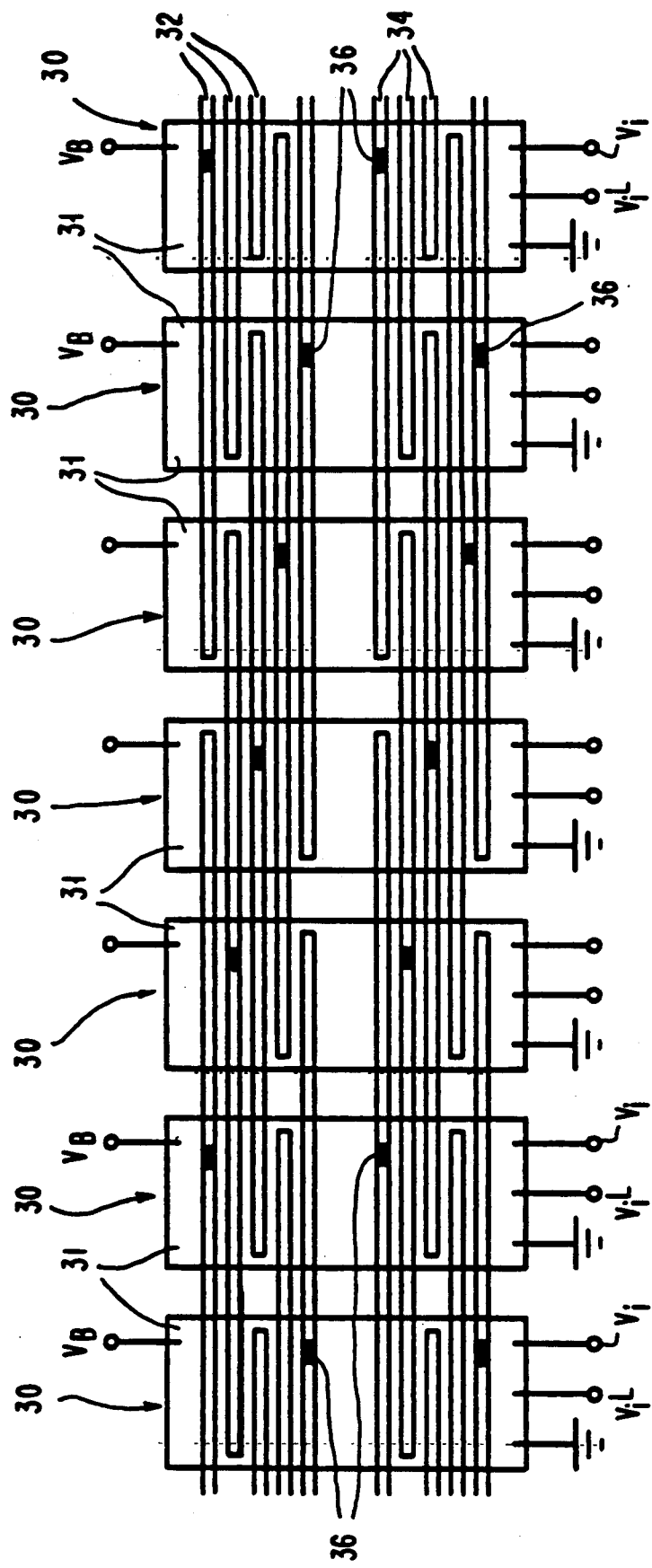
FIG. 4 is a schematic of a multigate FET implementation of a neural network of the present invention.
Figure 5:
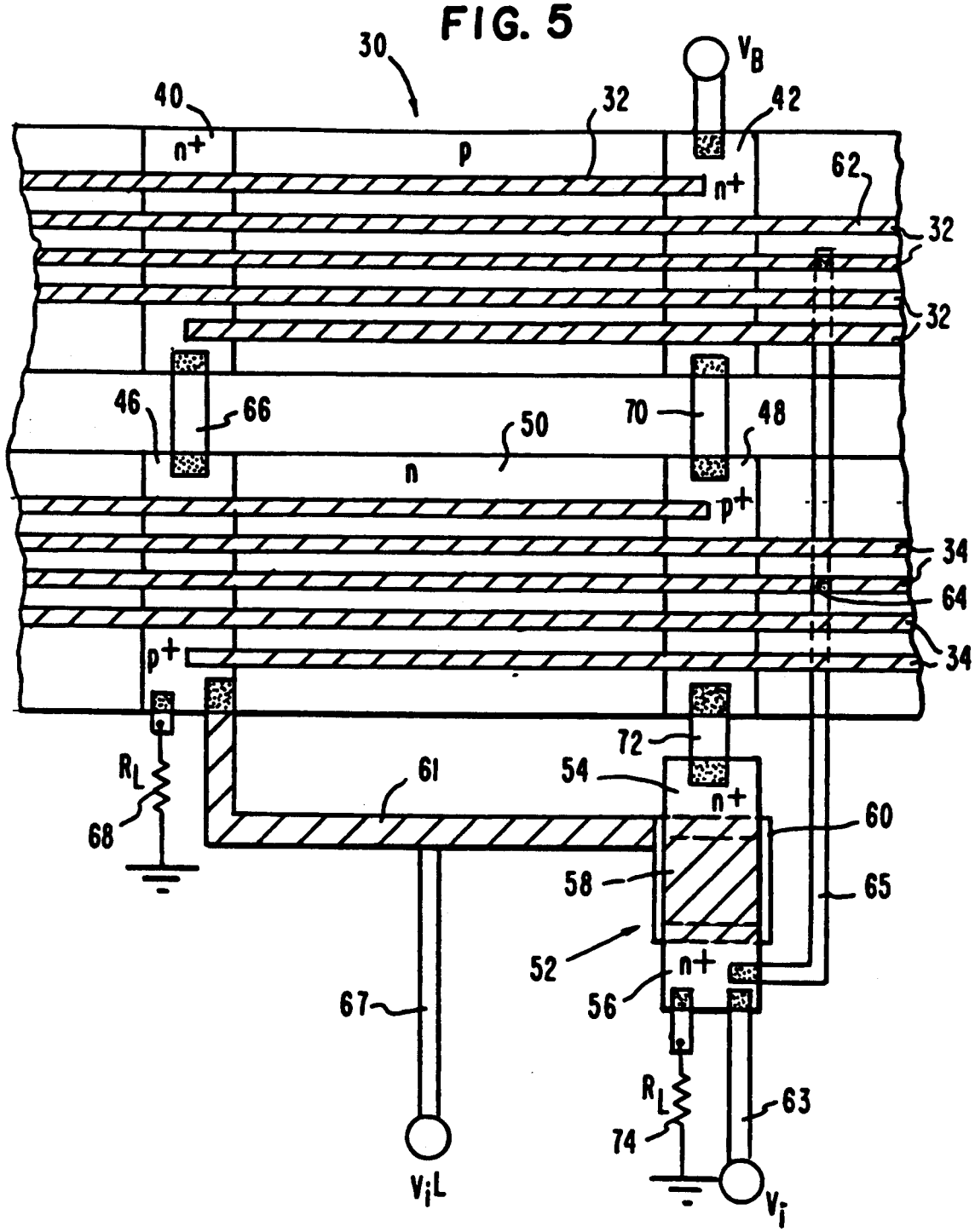
FIG. 5 is a schematic of one neuron of the multigate FET network of FIG. 4.

A particular implementation of the neural network of the present invention is shown in FIGS. 4 and 5 utilizing multigate MOSFETs. It should be understood that the MOSFETs may be implemented in silicon as well as other technologies such as GaAs. FIG. 4 shows a schematic layout of a portion of a network array, while FIG. 5 shows the details of an individual multigate MOSFET pair which comprises the learning elements of the array. The network array of FIG. 4 generally shows neurons 30 formed by the source and drain regions 31 and the input electrodes formed by the n-channel gate lines 32 and the p-channel gate lines 34. In the illustrative embodiment of FIG. 4, five gate lines are shown for each complementary FET thereby providing five learning elements in each neuron. The interconnection of the complementary FETs are shown in each neuron 30 by the connection nodes 36.

The interconnection of the multigate FETs is shown in more detail in FIG. 5 for one cell 30. The n-channel FETs include source n+-region 40 and drain n+-region 42 separated by p-region 44. Five gate lines 32 are disposed across the npn-regions with a corresponding insulator (not shown) disposed between the gates and the p-semiconductor to form five n-channel MOSFETs. Similarly, the p-channel FETs include source region 46 and drain region 48 having a p+-conductivity separated by n-region 50. Five gate lines 34 are disposed across the pnp-regions with a corresponding insulator (not shown) disposed between the gates and the n-semiconductor to form five p-channel MOSFETs. Output FET 52 is formed by n+-regions 54 and 56 and p-region 58 with gate region 60 disposed over a gate insulator (not shown) to form the MOSFET 52. The gate 60 is coupled to the source region 46 through gate line 61. The output $V_i$ of FET 52 is provided on electrode 63 and is fed back to one particular complementary pair of MOSFETs as shown by interconnect 65 which is connected to a corresponding pair of gate lines 32 and 34 by connections 62 and 64, respectively. The states to be learned $V_i^L$ are inputted to output FET 52 through electrode 67. The source regions 40 and 46 are directly coupled together by interconnect 66 and are connected to ground by load resistor 68. Similarly, drain regions 42 and 48 are coupled together by interconnect 70 and drain region 48 and source region 54 are connected by interconnect 72. The drain 56 is connected to ground through load resistor 74.

The output FET 52 is used as a high gain threshold switch. In the illustrative embodiment of FIG. 5, the FET 52 is non-inverting. However, this stage can be either inverting or non-inverting, which only affects the internal representation of the data and does not impact on the function of the neuron 30. In an inverting case, the synapse circuits would need to be adjusted accordingly. The output FET must have a non-linear input verses output characteristic to ensure the proper functioning of the network, as well as to restore signal levels to reasonable levels in any large complex system. The specific gain of the switch is an important practical term of the system because if the gain is not sufficiently high, learning of the system will be degraded.

Numerous devices may be used for implementing the insulator structure to allow for charge trapping. Simple oxide or MNOS structures can be utilized as shown by Chang, *IEEE Transactions on Electron Devices*, Vol. Ed-24, No. 5, (May 1977). In addition, dual electron injection structures can be utilized to enhance the charge trapping in the insulator. Also, an intervening layer of small conductive particles might be employed as a charge trapping layer in the insulator. These and other devices may be used in connection with more conventional semiconductor memory schemes to form the learning elements. It should be noted that it is advantageous to have the charge injection the same for either polarity of applied voltage.

The network of the present invention provides several advantages over the prior art Hopfield networks. The present network utilizes the operating characteristics of the underlying semiconductor device technology in its operation which facilitates fabrication in VLSI as well as reducing the overall size of the network. With the use of the device threshold as the memory elements, the network of the invention is capable of learning by example using a local learning algorithm. The algorithm is linear and is a built in characteristic of the devices which make up the network nodes. The network learns the desired outputs for a given pattern of inputs by the adjustment of the threshold values during the learning cycle. If a multiplicity of patterns are presented, each node learns a simple average of the patterns which is sees over a period of time. Nevertheless, the network as a whole learns the individual patterns which the network sees. The network is robust in that functioning is reasonably insensitive to quantitative changes to the various parameters. Changes in the learning parameter, the degree of saturation allowed for the thresholds, the gain of the threshold switches and the functional form of the network do not have an adverse affect on the function of the network. Once the network has learned the input patterns, a test input pattern is inputted and the network is allowed to come to an equilibrium state under the control of equations (1) or (2). The threshold values are maintained constant and the output of the network represents the final steady state memory of the network which was triggered by the input pattern.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

Having thus described the invention, what is claimed as new and what is desired to be secured by letters patent is:

1. A neural network comprising;
    a matrix of a plurality of output electrodes intersecting with a plurality of input electrodes at intersecting regions, and a plurality of electronic elements coupling said output electrodes to said input electrodes at said intersecting regions;

means interconnecting said electronic elements such that input signals are continuously processed by said electronic elements;

each of said electronic elements comprising an analog threshold device in which its output voltage increases substantially symmetrically in both the positive and negative directions from a threshold voltage as a function of its input voltage.

2. The neural network of claim 1 wherein the output voltage of each said threshold device increases substantially linearly in both the positive and negative directions from said threshold voltage as a function of its input voltage.

3. The neural network of claim 2 wherein each said threshold device includes means for adjusting the threshold voltage in response to a change in its input voltage.

4. The neural network of claim 3 wherein each said threshold device includes means for adjusting its threshold voltage proportional to the difference between its output voltage and its input voltage.

5. The neural network of claim 4 wherein said interconnecting means interconnects said threshold devices such that the output voltage of each said threshold device is proportional to the difference between its input voltage and a threshold voltage at its input.

6. The neural network of claim 5 wherein each said threshold device comprises a complementary pair of field effect transistors connected in parallel, the gates of said pair being connected together to an input terminal, the drains of said pair being connected together to an output terminal and the sources of said pair being connected together to a fixed potential.

7. The neural network of claim 6 wherein each said output electrode includes an output means, a plurality of said complementary pairs of FETs being connected in parallel to each said output electrode such that all the output terminals of said pairs of FETs are coupled to the output means of said output electrodes, the input terminal of each said pair of FETs being connected to one of said input electrodes, the input voltage applied to each input terminal of each said pair of FETs being a voltage from one of said output means.

8. The neural network of claim 7 wherein each said output electrode has an output voltage proportional to the sum of the output voltage of each threshold device connected to said output electrode of the form:

$$V_i^L = a \sum_{j=1}^{j=N} |V_j - T_{ij}|$$
$$a > 0$$

where;

$V_i^L$ = the output voltage of the ith output electrode;
$V_j$ = the input voltage applied to the jth input electrode;
$T_{ij}$ = the threshold voltage of the threshold device connecting the jth input electrode to the ith output electrode;
a = constant equal to the gain of the threshold devices connected to the ith output electrode;
i = 1 to M;
j = 1 to N;
M = total number of output electrodes;
N = total number of input electrodes.

9. The neural network of claim 7 wherein said proportional relationship between the input and output voltages of each threshold device is of the form $$V_i^L = a \sum_{j=1}^{j=N} (V_j - T_{ij})^2$$
$$a > 0$$

where;

$V_i^L$ = the output voltage of the ith output electrode;
$V_j$ = the input voltage applied to the jth input electrode;
$T_{ij}$ = the threshold voltage of the threshold device connecting the jth input electrode to the ith output electrode;
a = a constant equal to the gain of the threshold devices connected to the ith output electrode;
i = 1 to M;
j = 1 to N;
M = total number of output electrodes;
N = total number of input electrodes.

10. The neural network of claims 7 or 8 wherein each of said threshold devices having a threshold voltage adjustable in accordance with the function:

$$T_{ij}^* = T_{ij} + \alpha(|V_j - V_i| - \beta)$$

where;

$T_{ij}^*$ = the new threshold voltage;
$T_{ij}$ = the former threshold voltage;
$\alpha$ = constant that sets the adjustment rate;
$\beta$ = constant that ensure symmetry in the adjustment;
$V_i$ = the output voltage of the output means.

11. The neural network of claim 10 wherein each said output means is a threshold output amplifier.

12. The neural network of claim 11 wherein each said output amplifier has an input-output voltage characteristic such that for an input greater than a certain value, the output will be high and for an input less than said certain value, the output will be low.

13. The neural network of claim 11 wherein each said output amplifier has an input-output voltage characteristic such that for an input greater than a certain value, the output is low and for an input less than said certain value, the output is high.

14. The neural network of claim 10 wherein each of said FETs comprising each said complementing pair of FETs is a MOSFET having a gate insulator layer in which charge is trapped in said insulator layer at a rate equal to $\alpha(V_G - \beta)$ upon the application of a voltage $V_G$ to the gate of $(V_j - V_i)$ and charge leaks out of said insulator layer at a rate $\alpha\beta$ when voltage is removed from the gate.

15. A neural network suitable for information processing, comprising:

means for outputting a plurality of network output voltages, each of said network output voltages being the sum of the outputs of a series of learning elements having an adjustable threshold value as a memory means, the input of each respective learning element being a respective one of said network output voltages;

the output of each learning element being proportional to its input voltage minus a learned threshold value at its input, the output voltage having a functional relationship with respect to the input voltage which is symmetric and monotonically increasing about said threshold value;

the threshold value being adjustable as a function of the input voltage of the learning element and its corresponding network output voltage in a learning mode, the functional relationship being of the form:

$$T_{ij}^* = T_{ij} + \alpha(|V_j - V_i - \beta)$$

where, $T_{ij}^*$ = the new threshold value;
$T_{ij}$ = the former threshold value;
$\alpha$ = a learning rate constant;
$\beta$ = a learning step;
$V_i$ = the ith network output voltage;
$V_j$ = the jth input voltage of the network;
i=1 to M;
j=1 to N;
M = total number of output means;
N = total number of input electrodes.

means for selectively setting $\alpha$ to zero so that the threshold value remains constant in an associative memory mode;

whereby said neural network operates in said learning mode wherein in response to a pattern of desired output signals applied to the network, the threshold value of each learning element continually adjusts such that the threshold value of each element represents the learned states that will provide the desired output pattern in response to a given input pattern; and said neural network operates in said associative memory mode wherein the threshold values remain constant and the output of each learning element reaches a steady state that is only dependent upon the input signals of a test input pattern such that the output voltages of the network provide the desired learned output pattern most closely related to the test input pattern.

16. The neural network of claim 15 wherein said means for outputting a plurality of network output voltages includes a plurality of output amplifiers, each output amplifier being coupled to one of said series of learning elements, each of said learning elements comprising a complementary pair of multigate FETs connected in parallel.

17. The neural network of claim 16 wherein each of said pair of multigate FETs include common drain and source regions and an equal number of gates, the drain regions of each multigate FET being coupled to a corresponding output amplifier and the source regions being coupled to a fixed potential, each respective gate of one multigate FET being coupled to a corresponding respective gate of the other multigate FET of said pair, thereby forming a respective input terminal for each learning element of said series of learning elements.

18. The neural network of claim 17 wherein the sum of the output voltages of each learning element in each series of learning elements is of the form:

$$v_i^L = a \sum_{j=1}^{j=N} |V_j - T_{ij}|$$
$$a > 0$$

where, a is a constant set by the gain of the learning elements.

19. The neural network of claim 17 wherein the sum of the output voltages of each learning element in each series of learning element is of the form:

$$v_i^L = a \sum_{j=1}^{j=N} (V_j - T_{ij})^2$$
$$a > 0$$

where a is a constant set by the gain of the learning elements.

20. The neural network of claim 17 wherein said output amplifier has an input-output voltage characteristic such that for an input greater than a certain value, the output will be high and for an input less than said certain value, the output will be low.

21. The neural network of claim 17 wherein said output amplifier has an input-output voltage characteristic such that for an input greater than a certain value, the output is low and for an input less than said certain value, the output is high.

22. The neural network of claim 17 wherein said FETs are MOSFETs having a gate insulator in which charge is trapped in said insulator layer at a rate equal to $\alpha(V_G - \beta)$ upon the application of a voltage $V_G$ to the gate of $(V_j - V_i)$ and charge leaks out of said insulator layer at a rate $\alpha\beta$ when voltage is removed from the gate.

23. A memory element of an artificial neuron comprising: a complementary pair of field effect transistors connected in parallel, the gates of said pair being connected together to an input terminal, the drains of said pair being connected together to an output terminal and the sources of said pair being connected together to a fixed potential, the output voltage of said memory element increasing substantially symmetrically in both the positive and negative direction from a threshold voltage as a function of the input voltage of said memory element.

24. The memory element of claim 23 wherein the output voltage of said memory element increases substantially linearly in both the positive and negative directions from said threshold voltage as a function of its input voltage.

25. The memory element of claim 24 including means for adjusting the threshold voltage of said memory element in response to a change in its input voltage.

26. The memory element of claim 25 including means for adjusting the threshold voltage of said memory element proportional to the difference between its output voltage and its input voltage.

27. The memory element of claim 26 wherein the threshold voltage of said memory element is adjustable in accordance with the function:

$$T_{ij}^* = T_{ij} + \alpha(|V_j - V_i| - \beta)$$

where;

$T_{ij}^*$ = the new threshold voltage;
$T_{ij}$ = the former threshold voltage;
$\alpha$ = constant that sets the adjustment rate;
$\beta$ = constant that ensure symmetry in the adjustment;
$V_j$ = input voltage of the element;
$V_i$ = output voltage of the element.

28. The memory element of claim 27 wherein each of said FETs comprising said complementing pair of FETs is a MOSFET having a gate insulator layer in which charge is trapped in said insulator layer at a rate equal to $\alpha(V_G - \beta)$ upon the application of a voltage V to the gate of $(V_j - V_i)$ and charge leaks out of said insulator layer at a rate $\alpha\beta$ when voltage is removed from the gate.

* * * * *

UNITED STATES PATENT AND TRADEMARK OFFICE
CERTIFICATE OF CORRECTION

PATENT NO. : 5,010,512

DATED : April 23, 1991

INVENTOR(S) : Allan M. Hartstein, et al.

It is certified that error appears in the above-identified patent and that said Letters Patent is hereby corrected as shown below:

Column 9, line 59, Claim 8: "$Ti_j$" should read as --$T_{ij}$--

Column 11, line 6, Claim 15: "$(|V_j - V_i - \beta)$" should read as --$(|V_j - V_i| - \beta)$--

Column 12, line 66, Claim 28: "Vto" should read as --$V_G$ to--

Signed and Sealed this

Twelfth Day of January, 1993

Attest:

DOUGLAS B. COMER

*Attesting Officer*     *Acting Commissioner of Patents and Trademarks*